(12) United States Patent
Foong et al.

(10) Patent No.: US 6,547,121 B2
(45) Date of Patent: Apr. 15, 2003

(54) MECHANICAL CLAMPER FOR HEATED SUBSTRATES AT DIE ATTACH

(75) Inventors: Sally Y. L. Foong, Milpitas, CA (US); Kok Khoon Ho, Penang (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/764,133

(22) Filed: Jan. 19, 2001

(65) Prior Publication Data
US 2002/0106603 A1 Aug. 8, 2002

Related U.S. Application Data
(60) Provisional application No. 60/214,417, filed on Jun. 28, 2000.

(51) Int. Cl.[7] .......................... B23K 37/00; B23P 19/00
(52) U.S. Cl. .................. 228/44.7; 228/44.3; 228/49.1; 29/700; 29/724; 29/281.1; 29/281.4
(58) Field of Search ........................ 228/44.7, 44.3, 228/49.1, 4.5, 180.5; 118/301; 438/107; 29/700, 724, 281.1, 281.4; 414/754, 777

(56) References Cited

U.S. PATENT DOCUMENTS

| 3,791,567 | A | * | 2/1974 | Schott, Jr. ................... 226/112 |
| 3,847,004 | A | * | 11/1974 | Bringewald ................... 72/184 |
| 4,072,077 | A | * | 2/1978 | Morgan ....................... 29/566.3 |
| 4,280,039 | A | * | 7/1981 | Campbell et al. ........ 219/78.11 |
| 4,289,563 | A | * | 9/1981 | Wiechowski et al. ....... 156/423 |
| 4,341,333 | A | * | 7/1982 | Boa et al. ..................... 111/104 |
| 4,451,319 | A | * | 5/1984 | Off et al. ..................... 156/353 |
| 4,493,857 | A | * | 1/1985 | Knigge et al. ............... 427/211 |
| 4,674,670 | A | * | 6/1987 | Watanabe et al. ........... 228/102 |
| 4,908,153 | A | * | 3/1990 | Kossmann et al. ......... 118/426 |
| 5,038,155 | A | * | 8/1991 | Yamagishi et al. ......... 346/136 |
| 5,192,140 | A | * | 3/1993 | Nukada ........................ 400/26 |
| 5,540,153 | A | * | 7/1996 | Campbell et al. ........... 101/216 |
| 6,038,119 | A | * | 3/2000 | Atkins et al. ................ 361/118 |
| 6,047,468 | A | * | 4/2000 | Fogal et al. ............. 228/110.1 |
| 6,048,750 | A | * | 4/2000 | Hembree ..................... 438/107 |
| 6,106,365 | A | * | 8/2000 | Gessler ......................... 125/28 |
| 6,135,748 | A | * | 10/2000 | Steketee, Jr. ............ 264/177.19 |
| 6,189,762 | B1 | * | 2/2001 | Ball ............................. 228/4.5 |
| 6,192,956 | B1 | * | 2/2001 | Wensel ........................ 118/301 |
| 6,254,521 | B1 | * | 7/2001 | Pansier et al. .............. 493/194 |

FOREIGN PATENT DOCUMENTS

| EP | 0542465 A1 | | 5/1993 |
| WO | WO 02/01612 A2 | * | 1/2002 |

OTHER PUBLICATIONS

International Preliminary Examination Report dated Oct. 10, 2002.

* cited by examiner

Primary Examiner—M. Alexandra Elve
Assistant Examiner—L. Edmondson

(57) ABSTRACT

An apparatus is provided wherein a substrate is mechanically clamped to a heater block of a die bonder to hold down the heated substrate before and during the die bonding operation, thereby preventing warpage of the substrate. Embodiments include a clamp comprising a plurality of spring-loaded rollers which push down opposing outer edges of the substrate onto the heater block while the substrate is being heated and die bonded. The clamp minimizes warpage of the substrate by pushing the substrate flat onto the heater block, and allows the substrate to be moved into and away from the die bonding area.

10 Claims, 2 Drawing Sheets

US 6,547,121 B2

MECHANICAL CLAMPER FOR HEATED SUBSTRATES AT DIE ATTACH

This application claims priority from U.S. Provisional Patent Application Ser. No. 60/214,417, filed on Jun. 28, 2000, entitled: "Mechanical Clamper for Heated Substrates at Die Attach", the entire disclosure of which is hereby incorporated by reference therein.

FIELD OF THE INVENTION

The present invention relates to an apparatus for clamping substrates during a semiconductor die attach process. The present invention has particular applicability in die bonding semiconductor devices to thin laminated substrates.

BACKGROUND ART

Certain conventional fine-pitched ball grid array (FBGA) packaging schemes for semiconductor devices employ a substantially flat, rigid, multi-layer laminated substrate comprising gold tracers embedded in an organic resin, such as bismaleamide triazine ("BT resin"). Bare semiconductor devices, known as "dies", are attached to the substrate with epoxy, such as in a stacked die configuration, in a process known as "die bonding". Wires are attached between the dies and the substrate in a wire bonding operation, and the dies are then encapsulated, as by molding. Solder balls are thereafter attached to bonding pads on the underside of the substrate, and the packaged devices are singulated, tested and marked.

During the die bonding operation, a die is picked up, typically by an automatic pick-and-place die bonding head, and placed in a precise location on the substrate using a relatively small amount of pressure (e.g., about 150–200 grams). The die bonding operation requires the substrate to be heated to about 100–175 degrees Centigrade. Heating is typically performed via a heater block in the bed of the die bonding machine before and during die bonding.

However, the substrate, typically formed as a strip about 5 mm wide and about 190 mm long, tends to warp at the elevated die bonding temperature, preventing precise positioning of the die on the substrate. This imprecise die positioning results in lower yields and increased production costs. Conventional die bonders use vacuum to hold the substrate down against the bed and the heater block, but the substrate typically detaches from the vacuum holes in the bed when it warps. Thus, the use of vacuum to hold down the substrate is not effective to reliably prevent substrate warpage.

There exists a need for a die bonding apparatus for assembling thin substrate packages without substrate warpage, thereby reducing manufacturing costs and increasing production throughput.

SUMMARY OF THE INVENTION

An advantage of the present invention is a die bonding apparatus that prevents warpage of substrates before and during the die bonding procedure.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a clamp for clamping a substantially flat substrate to a bed of a processing machine, the clamp comprising a clamp body; a plurality of rollers for contacting a pair of opposing outer edges of the substrate and allowing the substrate to move along a longitudinal axis of the bed when the substrate is clamped to the bed; and a plurality of resilient fingers, each finger being attached to the clamp body and one of the rollers, for urging the roller against the substrate to prevent warpage of the substrate.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional methodologies for die bonding to relatively thin laminated substrates, such as organic FBGA substrates, result in warping of the substrate when the substrate is heated prior to and during the die bonding process, causing inaccurate die placement, which increases the cost of the finished device and reduces manufacturing yield. The present invention addresses and solves these problems stemming from conventional package assembly processes.

According to the methodology of the present invention, a substrate is mechanically clamped to a heater block of a die bonder to hold down the heated substrate before and during the die bonding operation, thereby preventing warpage of the substrate. In one embodiment of the present invention, a clamp is provided comprising a plurality of spring-loaded rollers which push down opposing outer edges of the substrate onto the heater block while the substrate is being heated and die bonded. The clamp minimizes warpage of the substrate by pushing the substrate flat onto the heater block, and allows the substrate to be moved into and away from the die bonding area.

Figure 1A:
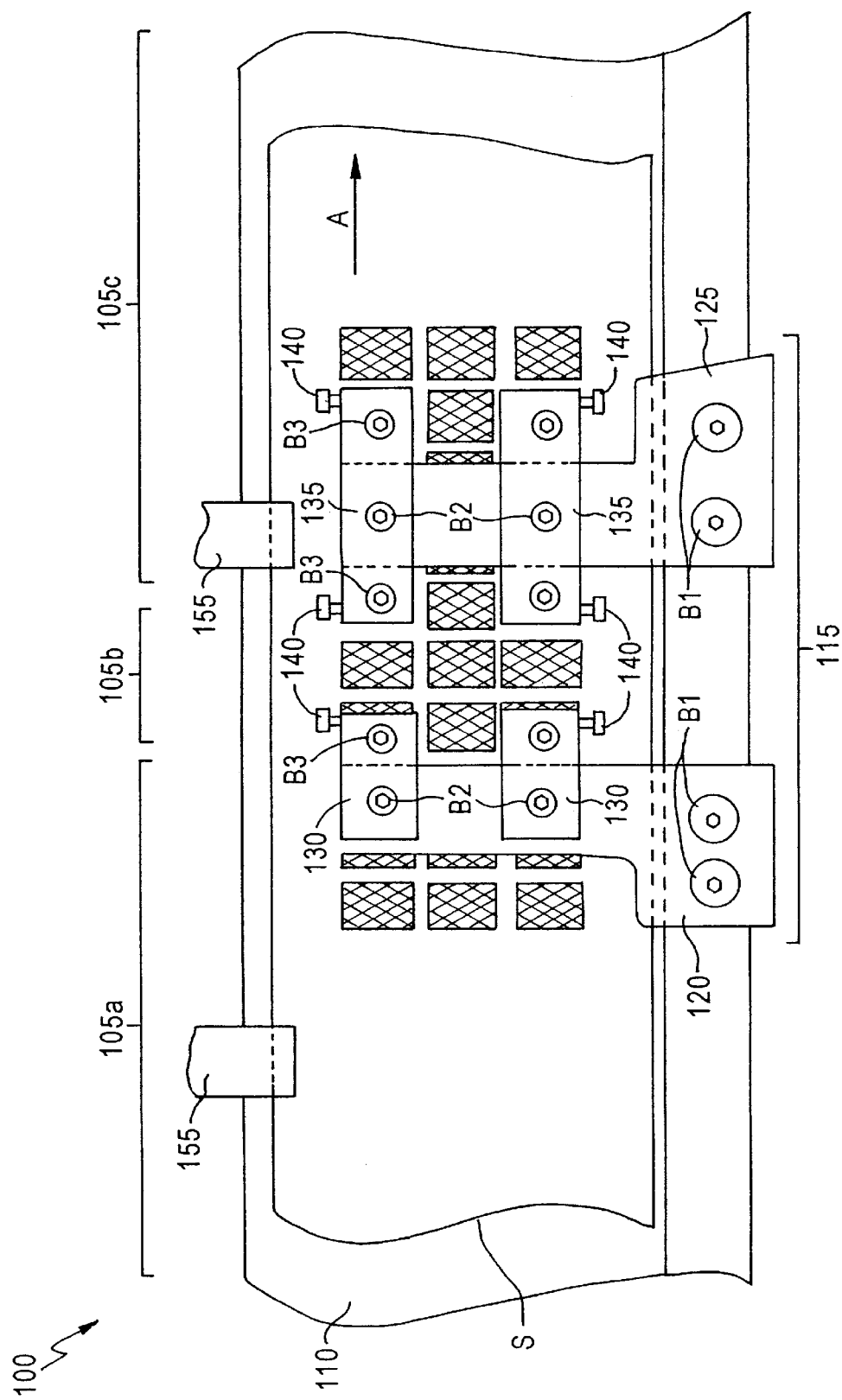
FIG. 1A is a top view of an apparatus according to an embodiment of the present invention.
Figure 1B:
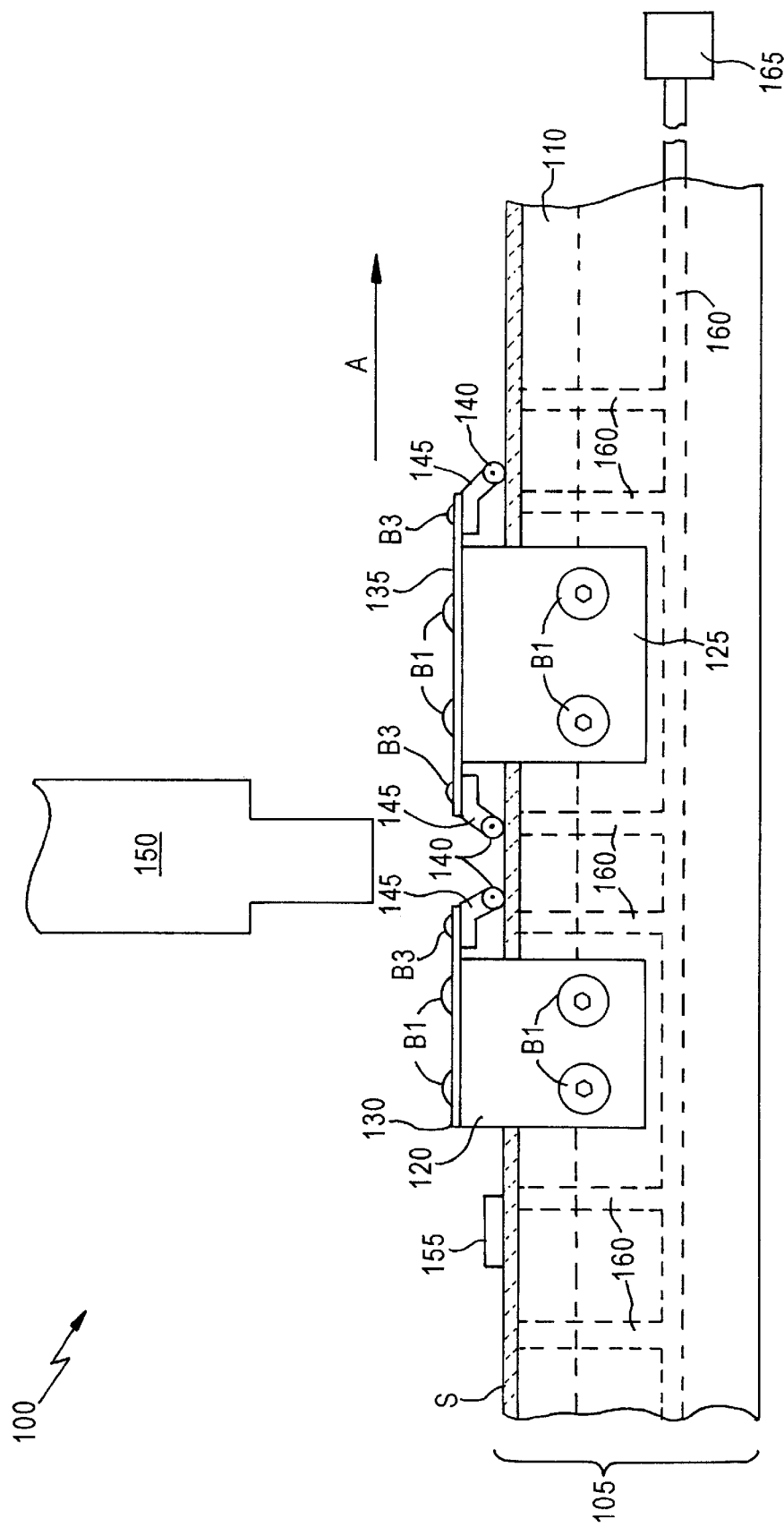
FIG. 1B is a side view of an apparatus according to an embodiment of the present invention.

A die bonding apparatus according to an embodiment of the invention is illustrated in FIGS. 1A–1B. The die bonding apparatus 100 comprises a bed 105 for supporting a substrate S, such as a laminated substrate comprising organic resin (e.g., BT resin) for FBGA packages. Substrate S includes an array of sites where dies are to be attached, which sites are indicated in FIG. 1A by cross-hatching. Bed 105 comprises a conventional heater block 110, such as an electric resistance heater, for conductively heating substrate S to a die bonding temperature; for example, about 100 degrees Centigrade to about 175 degrees Centigrade. Substrate S is moved along the longitudinal axis of bed 105 in the direction of arrow A using indexing clamps 155 of a conventional indexing mechanism (not shown), from a bed input portion 105a where it is preheated, to a die bonding portion 105b where semiconductor devices (not shown) are die bonded by a die bonding head 150, to an output portion 105c after attachment of the semiconductor devices.

Die bonder 100 also comprises a clamp 115 for clamping substrate S to bed 105 to prevent substrate S from warping when heated by heater block 110. Clamp 115 comprises a clamp body, shown in FIGS. 1A and 1B as a pair of branches 120, 125 extending across the width of substrate S above substrate S, and typically comprising metal such as steel. Branches 120, 125 are fixedly attached to bed 105, as by bolts B1. Resilient fingers 130, 135, such as strips C spring steel, are attached to branches 120, 125 by bolts B2. Rollers 140, such as ball bearing rollers, are attached to ends of fingers 130, 135 via blocks 145 and bolts B3. Rollers 140 contact the edges of substrate S and allow substrate S to be moved along the longitudinal axis of bed 105 by indexing clamps 155, while fingers 130, 135 urge rollers 140 against substrate S to prevent warpage of substrate S. Two rollers 140 are carried by branch 120 proximal to input portion 105a of bed 105. Four rollers 140 are preferably carried by branch 125 proximal to output portion 105c, to ensure that substrate S does not curl and contact branch 125 after the semiconductor devices are bonded to it. In other words, the four rollers 140 of branch 125 maintain a clearance between the bonded semiconductor devices and branch 125 of the clamp body.

Die bonder 100 can also include a conventional vacuum system comprising vacuum passages 160 in bed 105, and vacuum pump 165. Clamp 115 allows substrate S to remain flat on heater block 110 without warpage, thereby enabling the vacuum system to securely hold substrate S in position during die bonding.

The present invention enables semiconductor dies to be precisely placed on substrate S for bonding. Precise die placement is especially advantageous in the assembly of stacked die package structures, where a lower die is bonded to substrate S and an upper die is bonded to the lower die, then wire bonds are formed from the dies to the substrate. In prior art methodology, due to imprecise die placement relative to the substrate, the upper and lower dies, which have wire bonding pads on two opposing edges of their top surfaces, must be stacked oriented 90 degrees apart. Thus, wire bonds must be attached to four sides of the die stack. Thus requires a substrate with four layers of wiring, since the tracers inside the substrate need to be routed so they do not contact each other. The precise die placement of the present invention enables the two dies to be stacked on top of each other oriented in the same direction, therefore requiring wire bonds to be attached to only two sides of the die stack, and enabling the use of simpler, less expensive substrates with only two layers of wiring.

The present invention is applicable to the manufacture of various types of semiconductor packages where it is desired to prevent a heated substrate from warping.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. An apparatus for die bonding a semiconductor device to a substantially flat substrate having opposing outer peripheral edges, the apparatus comprising:
    a bed for supporting the substrate;
    a heater block in the bed for heating the substrate; and
    a clamp for clamping the substrate to the bed while the substrate moves along a longitudinal axis of the bed, the clamp including:
        a clamp body having a first branch and a second branch, each of the first and second branches extending across and above a width of the substrate in a direction normal to the longitudinal axis of the bed and having an end fixedly attached to an end of the bed, the semiconductor device being die bonded to the substrate passing under said each of the first and second branches of the clamp body,
        first and second resilient finger attached to said each of the first and second branches, and
        a pair of rollers attached to each of the first and second branches, wherein
    one roller of each pair of rollers is attached to the first resilient finger and contacts the substrate proximate one of the opposing outer peripheral edges and the other roller of said each pair of rollers is attached to the second resilient finger and contacts the substrate proximate the other of the opposing outer peripheral edges as the substrate moves along the longitudinal axis of the bed, preventing the substrate from warping when the substrate is heated by the heater block.

2. An apparatus for die bonding a semiconductor device to a substantially flat substrate, the apparatus comprising:
    a bed for supporting the substrate;
    a heater block in the bed for heating the substrate;
    a clamp for clamping the substrate to the bed for preventing the substrate from warping when the substrate is heated by the heater block, the clamp including:
        a clamp body,
        a plurality of rollers for contacting a pair of opposing outer edges of the substrate and allowing the substrate to move along a longitudinal axis of the bed when the substrate is clamped to the bed, and
        a plurality of resilient fingers, each finger being attached to the clamp body and one of the rollers, for urging the roller against the substrate to prevent warpage of the substrate,
    the clamp body including:
        a plurality of branches extending across the width of the substrate above the substrate,
    the bed including:
        an input portion,
        a die bonding portion, and
        an output portion; and
    a die bonding head located at the die bonding portion for attaching the semiconductor device to the substrate, wherein the substrate is moved from the input portion of the bed to the die bonding portion of the bed for attachment of the semiconductor device, and the substrate is moved from the die bonding portion to the output portion of the bed after the semiconductor device is attached to the substrate, a first branch of the clamp body is proximal to the input portion, and a second branch of the clamp body is proximal to the output portion, a portion of the plurality of rollers are attached to the second branch of the clamp body for maintaining a clearance between the semiconductor device and the clamp body, and two of the rollers are associated with the first branch and four of the rollers are associated with the second branch.

3. An apparatus for die bonding a semiconductor device to a substantially flat substrate, the apparatus comprising:

a bed for supporting the substrate;

a heater block in the bed for heating the substrate; and a clamp for clamping the substrate to the bed while the substrate moves along a longitudinal axis of the bed, the clamp including:
- a clamp body having a plurality of branches, each branch extending across and above a width of the substrate in an direction normal to the longitudinal axis of the bed and having an end fixedly attached to an end of the bed with the semiconductor device being die bonded to the substrate passing under each branch of the clamp body,
- a plurality of rollers for contacting a pair of opposing outer edges of the substrate, and
- a plurality of resilient fingers, two fingers being attached to each branch of the clamp body with at least one roller attached to each finger for urging the roller against the substrate while the substrate moves along the longitudinal axis of the bed, preventing the substrate from warping when the substrate is heated by the heater block.

4. The apparatus of claim 3, wherein the substrate comprises an organic material, and the heater is for heating the substrate to about 100 degrees Centigrade to about 175 degrees Centigrade.

5. The apparatus of claim 3, further comprising a vacuum system for holding the substrate to the bed.

6. The apparatus of claim 3, wherein the rollers comprise ball bearings.

7. The apparatus of claim 3, wherein the fingers comprise spring steel.

8. The apparatus of claim 3, wherein at least two of the rollers are associated with each branch.

9. The apparatus of claim 3, wherein the bed comprises an input portion, a die bonding portion and an output portion, the apparatus further comprising a die bonding head located at the die bonding portion for attaching the semiconductor device to the substrate;

wherein the substrate is moved from the input portion of the bed to the die bonding portion of the bed for attachment of the semiconductor device, and the substrate is moved from the die bonding portion to the output portion of the bed after the semiconductor device is attached to the substrate;

wherein a first branch of the clamp body is proximal to the input portion, and a second branch of the clamp body is proximal to the output portion; and wherein a portion of the plurality of rollers are attached to the second branch of the clamp body for maintaining a clearance between the semiconductor device and the clamp body.

10. The apparatus of claim 9, wherein two of the rollers are associated with the first branch and four of the rollers are associated with the second branch.

* * * * *